(12) United States Patent
Oida et al.

(10) Patent No.: US 7,245,884 B2
(45) Date of Patent: Jul. 17, 2007

(54) RF MODULE

(75) Inventors: Toshifumi Oida, Omihachiman (JP);
Takahiro Watanabe, Shiga-ken (JP);
Eigoro Ina, Shiga-ken (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1006 days.

(21) Appl. No.: 09/884,274

(22) Filed: Jun. 19, 2001

(65) Prior Publication Data

US 2002/0049042 A1    Apr. 25, 2002

(30) Foreign Application Priority Data

Jun. 20, 2000    (JP)    ............... 2000-184046

(51) Int. Cl.
*H04B 1/38*    (2006.01)
(52) U.S. Cl. .......................... 455/90; 455/73
(58) Field of Classification Search .......... 455/253.2, 455/90, 259, 73; 174/258; 257/686, 664, 257/728; 349/150
See application file for complete search history.

(56) References Cited

U.S. PATENT DOCUMENTS

| | | | |
|---|---|---|---|
| 5,182,631 A * | 1/1993 | Tomimuro et al. | 257/664 |
| 5,450,046 A | 9/1995 | Kosugi et al. | |
| 5,686,759 A | 11/1997 | Hyde et al. | |
| 5,717,249 A | 2/1998 | Yoshikawa et al. | |
| 5,838,412 A * | 11/1998 | Ueda et al. | 349/150 |
| 5,898,909 A * | 4/1999 | Yoshihara et al. | 455/73 |
| 6,396,144 B1 * | 5/2002 | Koyama | 257/728 |
| 6,463,267 B1 * | 10/2002 | Akamine et al. | 455/253.2 |
| 6,526,270 B1 * | 2/2003 | Nakashima | 455/259 |
| 6,538,210 B2 * | 3/2003 | Sugaya et al. | 174/258 |
| 6,658,243 B2 * | 12/2003 | Akamine et al. | 455/253.2 |
| 6,734,539 B2 * | 5/2004 | Degani et al. | 257/686 |

FOREIGN PATENT DOCUMENTS

| | | |
|---|---|---|
| EP | 0 309 942 A2 | 4/1989 |
| EP | 0 818 823 A2 | 1/1998 |
| EP | 0 866 517 A2 | 9/1998 |

(Continued)

OTHER PUBLICATIONS

Drevon et al.: "Mixed L.F./R.F. MCM"; Electronic Components and Technology Conference; 1997; IEEE; US; pp. 497-501.

(Continued)

*Primary Examiner*—Bing Q. Bui
*Assistant Examiner*—Thjuan P. Knowlin
(74) *Attorney, Agent, or Firm*—Keating & Bennett, LLP

(57) ABSTRACT

An RF module includes a multi-layered substrate. A base-band IC, a memory IC, a quartz oscillator and surface-mount components are mounted on the upper surface of the multi-layered substrate. A metallic cap also is attached to the upper surface of the multi-layered substrate. A cavity is formed in the lower surface of the multi-layered substrate substantially at the center thereof. A first RF-IC and a second RF-IC are embedded in the cavity. Wiring patterns for providing connections between the base-band IC and the memory IC, through-holes, RF passive components, and the shield ground electrode pattern are disposed inside of the multi-layered substrate.

9 Claims, 9 Drawing Sheets

FOREIGN PATENT DOCUMENTS

| | | |
|---|---|---|
| EP | 0 996 155 | 4/2000 |
| EP | 0 996 155 A2 | 4/2000 |
| EP | 1 094 538 A2 | 4/2001 |
| JP | 06-302709 | 10/1994 |
| JP | 08-321567 | 12/1996 |
| JP | 9-275160 | 10/1997 |
| JP | 10-303640 | 11/1998 |
| WO | WO 99/21245 | 4/1999 |

OTHER PUBLICATIONS

Nakatsugawa et al.; "Line-Loss and Size Reduction Techniques for Millimeter-Wave RF Front-End Boards by Using a Polyimide/Alumina-Ceramic Multilayer Configuration"; IEEE Transactions on Microwave Theory and Techniques, IEEE Inc. New York; US; vol. 45; NR. 12; Part 2; pp. 2308-2315.

Nakatsugawa et al., "Line-Loss and Size Reduction Techniques for Millimeter-Wave RF Front-End Boards by Using a Polyimide/Alumina-Ceramic Multilayer Configuration," IEEE Tansactions on Microwave Theory and Techniques; IEEE, Piscataway, New York, US; vol. 45, No. 12, Part 2, Dec. 1997, p. 2308-2315.

Drevon et al., "Mixed L.F./R.F. MCM," 1997 Proceedings, 47th Electronic Components and Technology Conference; San Jose, CA, USA, May 18-21, 1997; IEEE, New York, USA, p. 497-501.

Translation of Official Communication filed in corresponding Finnish Paten Application No. 2001-1247, dated Dec. 30, 2005.

* cited by examiner

RF MODULE

BACKGROUND OF THE INVENTION

1. Field of the Invention

The present invention relates to an RF module and, more particularly, to an RF module that includes ICs such as an RF-IC, a base-band IC, and a memory IC mounted on a substrate, and which is used, for example, in a mobile communication terminal.

2. Description of the Related Art

RF modules have been developed and used in mobile communication terminals. Such an RF module typically has components such as an RF-IC, a base-band IC, a memory IC and a quartz oscillator, which are mounted on a single-layered printed circuit board.

A conventional RF module that does not include an antenna typically has approximate dimensions of 33 mm long, 17 mm wide and 3.65 mm thick. Another RF module, which has a built-in antenna on the substrate, typically has approximate dimensions of 32 mm long, 15 mm wide and 2.9 mm thick is also available. These RF modules are too large to be mounted in, for example, a portable phone.

SUMMARY OF THE INVENTION

In order to overcome the problems described above, preferred embodiments of the present invention provide an RF module that has greatly reduced dimensions and excellent performance.

According to a preferred embodiment of the present invention, an RF module includes a multi-layered substrate, a base-band IC, a memory IC and an RF-IC mounted on the multi-layered substrate, an RF passive component incorporated in the multi-layered substrate, and a wiring pattern incorporated in the multi-layered substrate, the wiring pattern interconnecting the base-band IC and the memory IC.

The RF module may further include an antenna incorporated in the multi-layered substrate.

At least one of the base-band IC, the memory IC and the RF-IC may be a bare chip.

When such a bare chip is used, the arrangement may be such that at least one cavity is formed in a portion of the multi-layered substrate, and the bare chip is disposed in the cavity.

The RF module of various preferred embodiments of the present invention may be configured such that the base-band IC and the memory IC are mounted on one side of the multi-layered substrate, while the RF-IC is mounted on the other side of the multi-layered substrate.

The RF module of preferred embodiments of the present invention may also include a shielding ground electrode pattern interposed between the side of the multi-layered substrate on which the band IC and the memory IC are mounted and the RF passive component incorporated in the multi-layered substrate.

The RF module may further include at least one trimming electrode pattern disposed on a surface of the multi-layered substrate, for enabling adjustment of frequency characteristics.

When a bare chip is used as the RF-IC, the RF module may also include a ground pattern for preventing RF signal radiation provided within the multi-layered substrate at a location on the bottom surface of the bare chip, so as to prevent unnecessary radiation of RF signals from the RF-IC. The RF module may also include a plurality of via holes arranged within the multi-layered substrate and around the bare chip, the via holes providing connection to the ground electrode pattern for preventing RF signal radiation.

The RF module may also include a metallic case disposed on the multi-layered substrate and defining a part of an antenna.

In the RF module of various preferred embodiments of the present invention having the above-described features, a multi-layered substrate is preferably used as the substrate, and the RF passive component and the wiring pattern interconnecting the base-band IC and the memory IC are preferably selectively incorporated in the multi-layered substrate. Therefore, the RF module of various preferred embodiments of the present invention is greatly reduced in size as compared with conventional RF modules and can suitably be mounted in, for example, a portable phone.

The above and other elements, characteristics, features and advantages of the present invention will become clear from the following description of preferred embodiments taken in conjunction with the accompanying drawings.

DETAILED DESCRIPTION OF PREFERRED EMBODIMENTS

Figure 1:
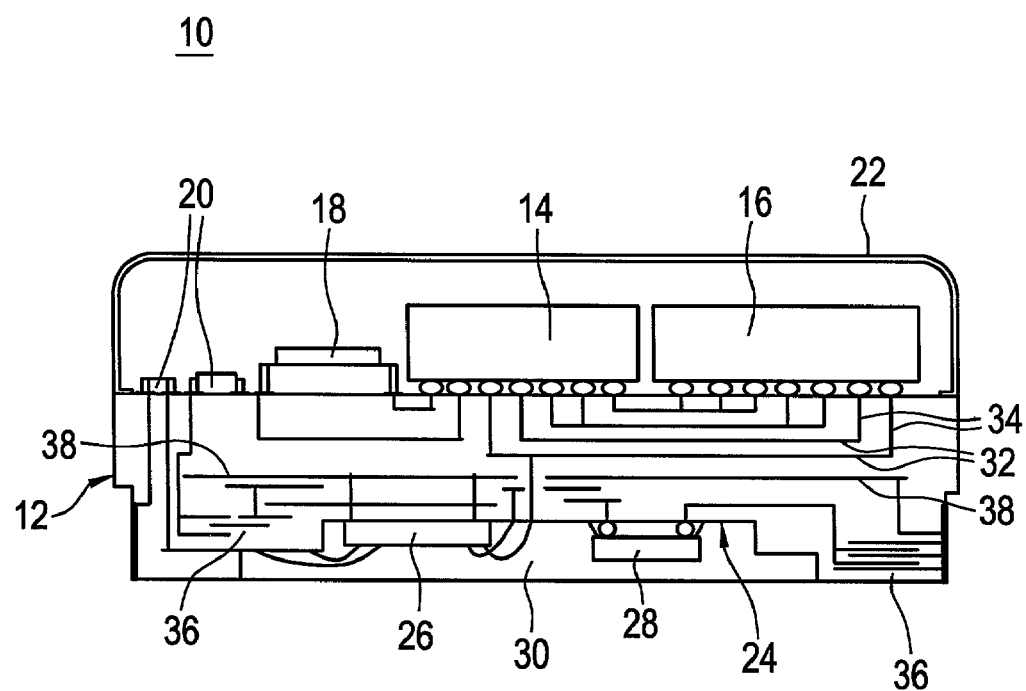
FIG. 1 is a front elevational diagrammatic illustration of an RF module in accordance with a preferred embodiment of the present invention.
Figure 2:
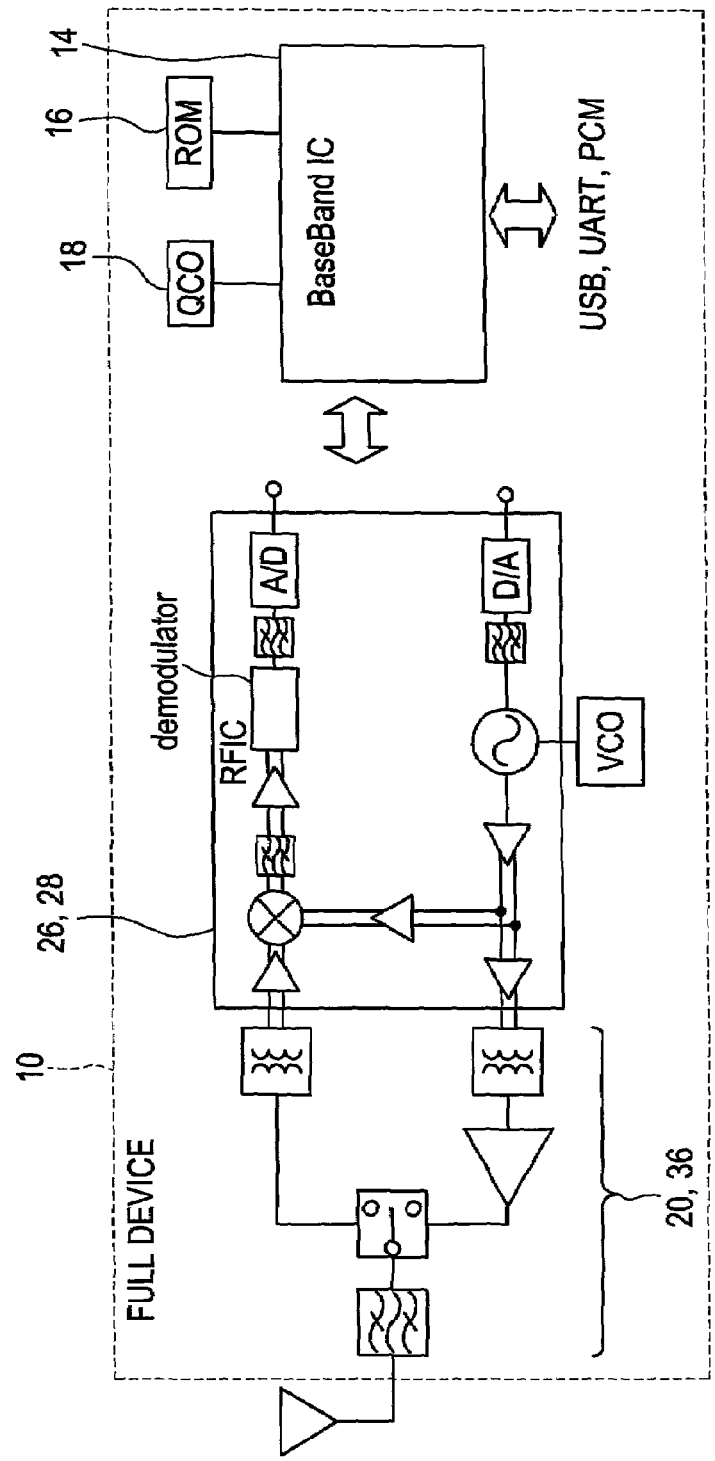
FIG. 2 is a circuit diagram of the RF module shown in FIG. 1.

FIG. 1 is a front elevational diagrammatic illustration of an RF module of a preferred embodiment of the present invention, while FIG. 2 is a circuit diagram of the RF module according to a preferred embodiment of the present invention. The RF module 10 shown in FIG. 1 preferably has a multi-layered substrate 12 made of, for example, low temperature co-fired ceramics.

A base-band IC 14, a memory IC 16, a quartz oscillator 18 and surface-mounted components 20 are mounted on the upper surface of the multi-layered substrate 12.

The base-band IC 14 processes base band signals, as well as, performing overall control of the RF module 10. More specifically, the base-band IC performs operations such as the switching between transmitting and receiving modes, control of a PLL circuit and of Power Amplifier (PA), and so forth, while functioning as an interface for connection to host-side terminals such as a USB (Universal Serial Bus), a UART (Universal Asynchronous Receiver Transmitter) and a PCM (Pulse Code Modulation).

The memory IC (ROM) 16 is, for example, a flash memory that stores control software for controlling the operation of the RF module 10.

The quartz oscillator (QCO) 18 is connected to the base-band IC 14 and is used as a reference oscillator.

The surface-mounted components preferably include electronic components such as a chip-type inductor, a chip-type capacitor, a chip resistor, a chip-type transistor, and a chip-type diode and other suitable components.

A metallic case 22 is secured to the upper surface of the multi-layered substrate 12, so as to cover the base-band IC 14, the memory IC 16, the quartz oscillator 18 and the surface-mount components 20.

A cavity 24 is preferably formed in the lower surface of the multi-layered substrate 12 at the approximately central portion thereof. A first RF-IC 26 and a second RF-IC 28, which are RF-ICs for processing RF signals, are disposed in the cavity 24. By way of example, the first RF-IC 26 and the second RF-IC 28 are bare chips. The first RF-IC 26 and the second RF-IC 28 are covered with a resin 30 that is arranged to fill the cavity 24.

Wiring conductor patterns 34 and through-holes 34 interconnecting the base-band IC 14 and the memory IC 16, RF passive components 36, and a shielding ground electrode pattern 38 are preferably disposed inside of the multi-layered substrate 12.

The RF passive components 36 include, for example, passive elements such as an inductor, a capacitor, a distributed-constant line, a resonator, a LC filter, and a balun, and provides a front end portion of a communication terminal in cooperation with the RF surface-mounted components 20. The shielding ground electrode pattern 38 is preferably located between the base-band IC 14 and the memory IC 16, and the RF passive components 36.

By way of example, the RF module 10 has a block diagram of a FULL DEVICE shown in FIG. 2.

This RF module 10 has a much smaller size than conventional RF modules and, therefore, can be mounted in a device such as a portable phone, by virtue of the fact that the wiring patterns 32, the through-holes 34, the RF passive components 36 and the shielding ground electrode pattern 38 are disposed inside of the multi-layered substrate 12.

In conventional RF modules, wiring patterns for interconnecting components are disposed on the surface of the printed circuit board. To the contrary, in accordance with preferred embodiments of the present invention, however, these wiring patterns are arranged inside the multi-layered substrate 12, thus offering improvement in the RF characteristics.

This RF module 10 achieves further improved characteristics, e.g., reliability, if ceramics dielectric materials which can be sintered at low temperature are used to form the multi-layered substrate 12 while highly conductive materials such as Cu or Ag are used as the material of the wiring patterns and electrode pattern inside of the multi-layered substrate 12.

In this RF module 10, control components such as the base-band IC 14, the memory IC 16 and other elements are preferably mounted on the upper surface of the multi-layered substrate 12, while RF components such as the first RF-IC 26 and the second RF-IC 28 are mounted on the lower surface of the multi-layered substrate 12, thus allowing significant reduction in the surface area of the multi-layered substrate 12 through effective use of both major surfaces of the same.

In this RF module 10, semiconductive devices such as the base-band IC 14 and the memory IC 16 and the RF components such as the first RF-IC 26 and the second RF-IC 28 are shared on both sides of the multi-layered substrate 12, so that the wiring patterns interconnecting the control terminals of the control system and the control terminal of the RF system are shortened, thus contributing to a reduction in the size of the RF module, as well as providing significant reductions in signal losses.

In this RF module 10, the components of the control system are preferably disposed on an upper layer of the multi-layered substrate 12, while the components of the RF system are preferably disposed on a lower layer of the multi-layered substrate 12, with the shielding ground electrode pattern 38 being disposed therebetween, so that the control system and the RF system are isolated from each other by the shielding ground electrode pattern 38. Consequently, interference of signals between the control block including the base-band IC 14 and the memory IC 16 and the RF block including the first RF-IC 26 and the second RF-IC 28 is prevented to achieve a higher stability of operations of the respective blocks.

In this RF module 10, the first RF-IC 26 and the second RF-IC 28 are disposed in the cavity 24 provided in the lower surface of the multi-layered substrate 12, thus achieving flatness of the lower surface of the module, which in turn makes it possible to use ordinary land-type I/O electrodes. This RF module therefore enables surface mounting even when a double-sided substrate is used.

Furthermore, in this RF module 10, the first RF-IC 26 and the second RF-IC 28 are preferably bare chips and, therefore, can easily be mounted in the cavity 24, thus contributing to further reduction in the size of the RF module.

Figure 3:
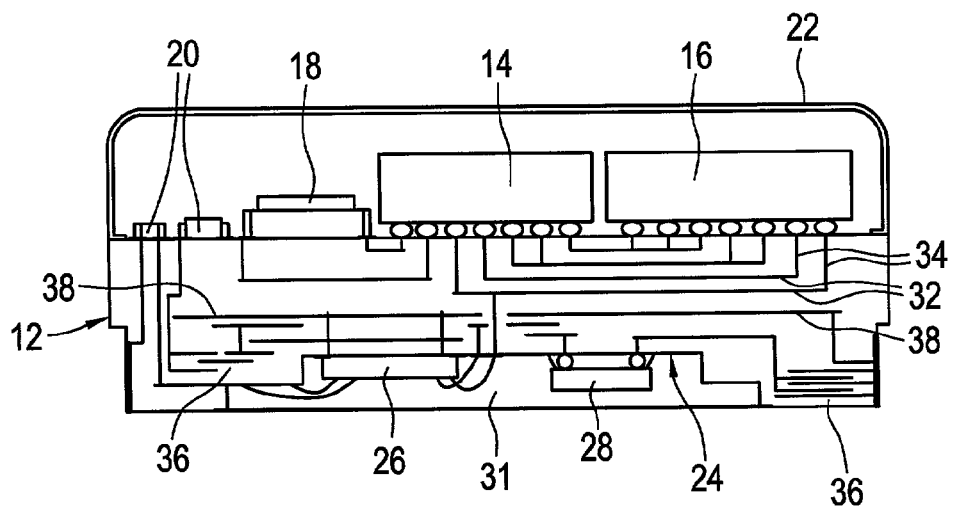
FIG. 3 is a front elevational diagrammatic illustration of another preferred embodiment of the RF module in accordance with the present invention.

FIG. 3 is a front elevational diagrammatic illustration of another preferred embodiment of the RF module in accordance with the present invention. In the RF module shown in FIG. 3, the resin 30 used in the RF module 10 of FIG. 1 to fill the cavity 24 is substituted by a metallic cap 31 that is fixed to the multi-layered substrate 12 so as to seal the cavity 24.

The RF module 10*a* shown in FIG. 3 offers an advantage over the RF module 10 of FIG. 1 in that the metallic cap 31 also functions as a shield for the first RF-IC 26 and the second RF-IC 28.

Figure 4:
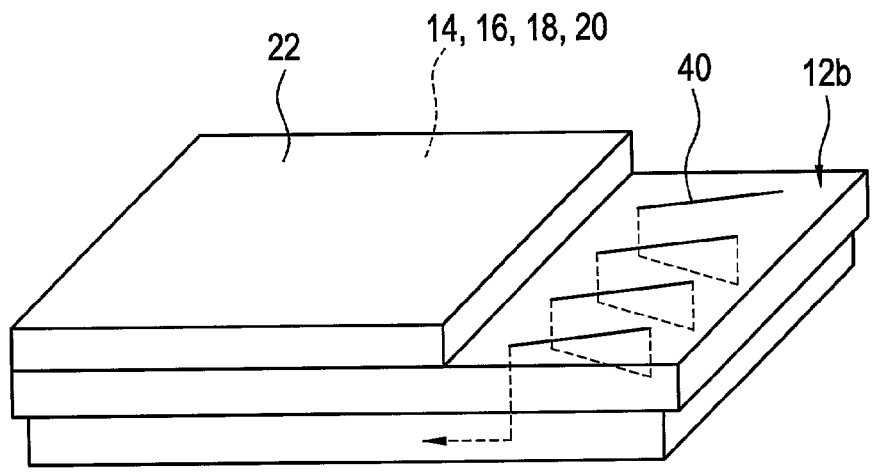
FIG. 4 is a perspective view of still another preferred embodiment of the RF module in accordance with the present invention.
Figure 5:
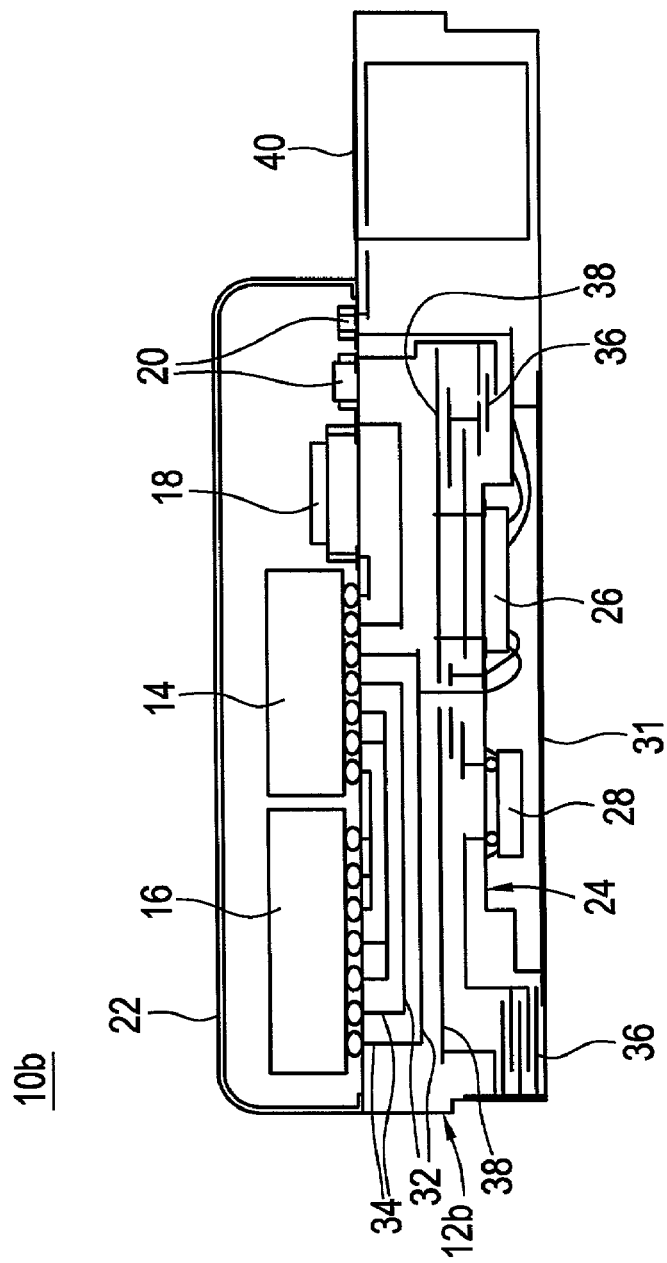
FIG. 5 is a front elevational diagrammatic illustration of the RF module shown in FIG. 4.
Figure 6:
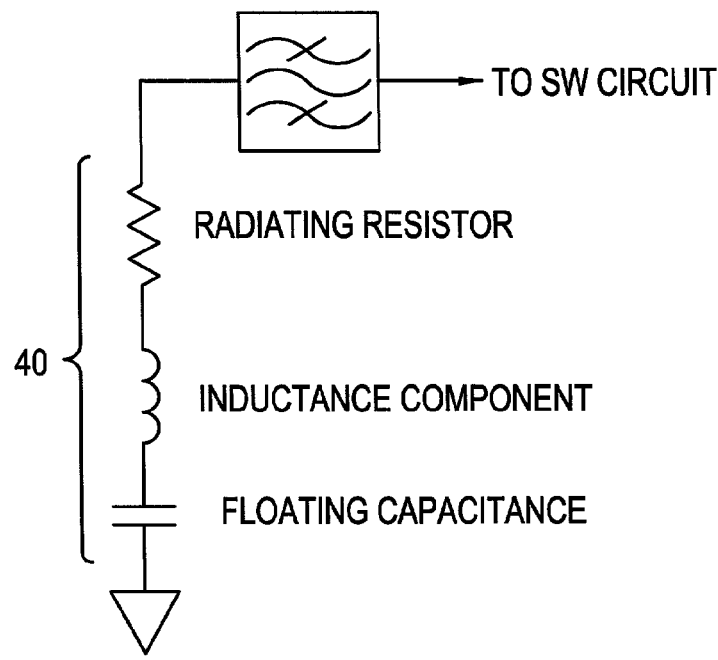
FIG. 6 is an equivalent circuit diagram of an antenna of the RF module shown in FIG. 4.

FIG. 4 is a perspective view of still another preferred embodiment of the RF module in accordance with the present invention. FIG. 5 is a front elevational diagrammatic illustration of this RF module, while FIG. 6 is an equivalent circuit diagram of an antenna of the same. The RF module 10*b* shown in FIG. 4 has a multi-layered substrate 12*b* that is slightly greater than that of the RF module 10*a* shown in FIG. 3, and a spiral antenna 40 having an electrode pattern and through-holes is incorporated in the RF module 10*b*.

Figure 7:
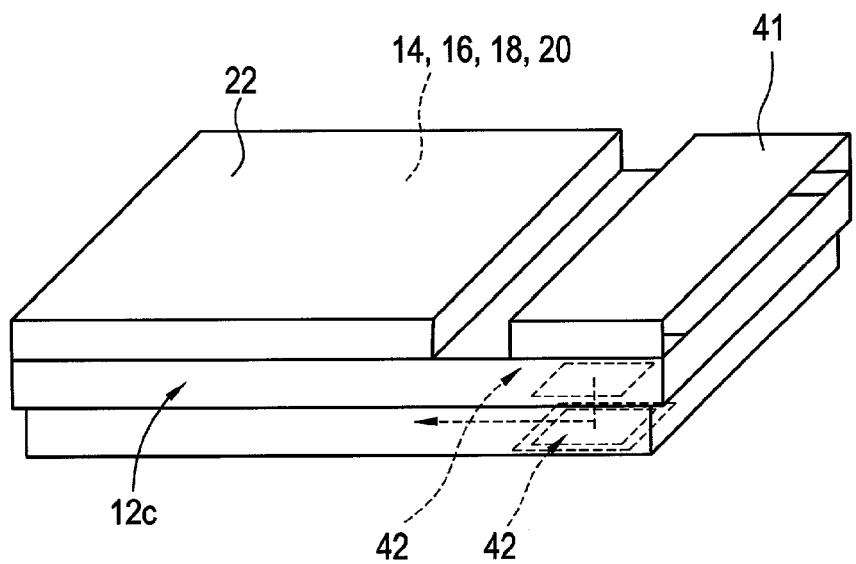
FIG. 7 is a perspective view of a yet another preferred embodiment of the RF module in accordance with the present invention.
Figure 8:
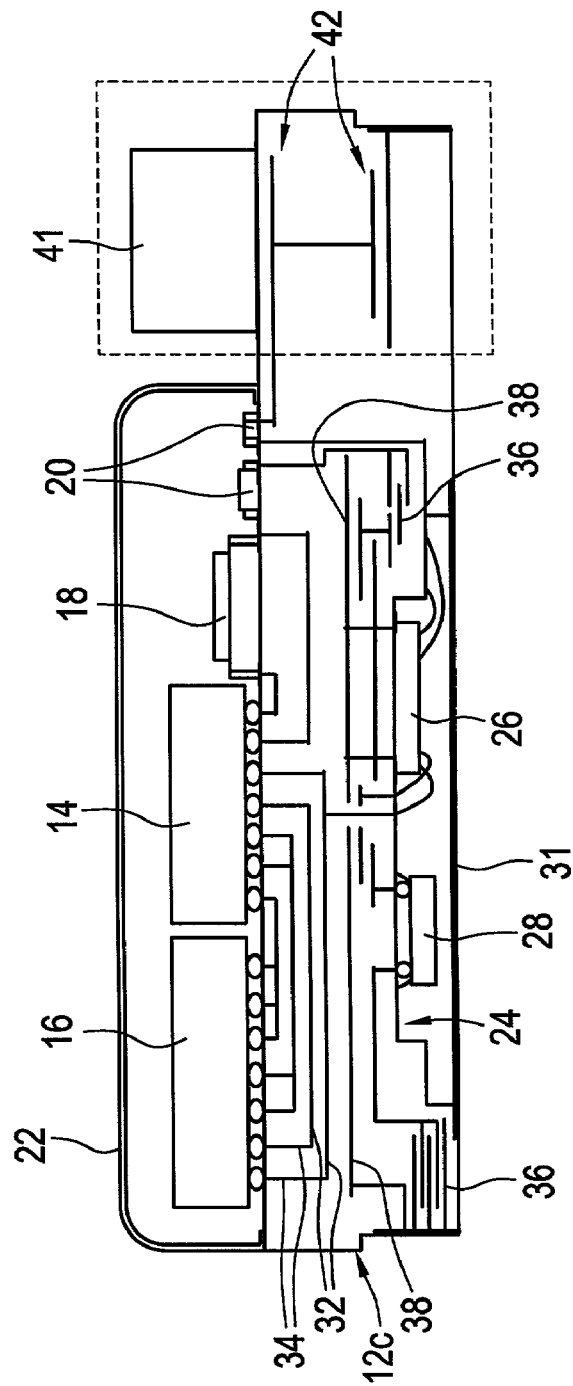
FIG. 8 is a front elevational diagrammatic illustration of the RF module shown in FIG. 7.
Figure 9:
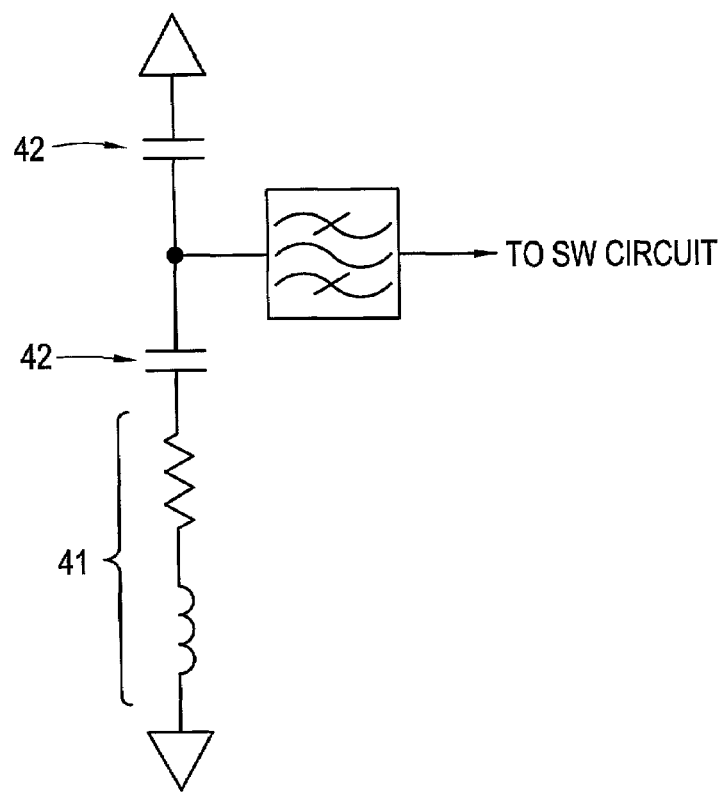
FIG. 9 is an equivalent circuit diagram of an antenna of the RF module shown in FIG. 7.

FIG. 7 is a perspective view of a yet another example of the RF module in accordance with a preferred embodiment of the present invention. FIG. 8 is a front elevational diagrammatic illustration of this RF module, while FIG. 9 is an equivalent circuit diagram of an antenna of the same. The RF module 10c shown in FIG. 7 has a multi-layered substrate 12c that is slightly greater than that of the RF module 10a shown in FIG. 3, and an antenna 40 including a loop-shaped metallic sheet is incorporated in the upper surface of the multi-layered substrate 12c. In addition, a matching capacitor 42 also is provided inside of the multi-layered substrate 12. The antenna may include a combination of the loop-shaped metallic sheet and the metallic case 22, or of the metallic case 22 alone.

The RF module 10b shown in FIG. 4 has the antenna 40 incorporated inside the multi-layered substrate 2b, and the RF module 10c shown in FIG. 7 has the antenna 41 and the matching capacitor 42 incorporated inside the multi-layered substrate 12c. Therefore, these RF modules 10b and 10c have greatly reduced sizes as compared with the cases where the antenna is externally mounted.

The RF module 10 shown in FIG. 1, when an antenna is externally mounted thereon, requires a great deal of work to be done by the user for achieving matching between the antenna and the wireless device.

In contrast, the RF module 10b shown in FIG. 4 and the RF module 10c shown in FIG. 7 eliminate the needs for such work for establishing matching to be done by the user, because these RF modules can be designed to inherently achieve matching, by virtue of the incorporation of the antenna 40 or both the antenna 41 and the matching capacitor 42.

Figure 10:
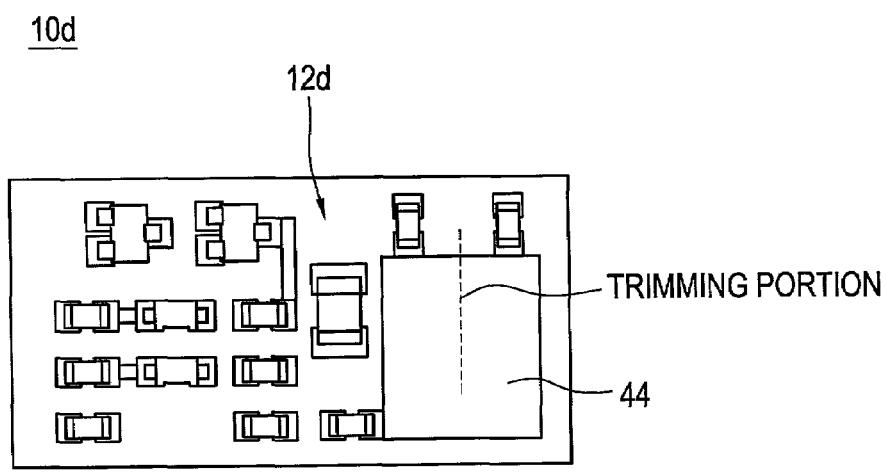
FIG. 10 is a diagrammatic plan view of a further preferred embodiment of the RF module in accordance with the present invention.
Figure 11:
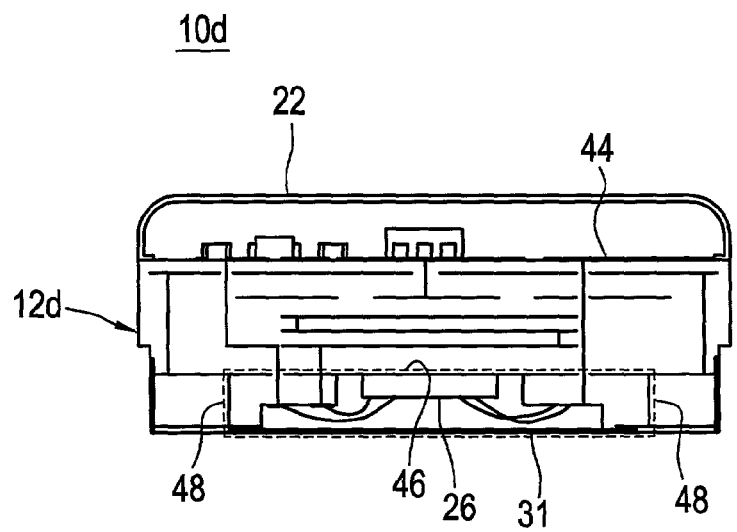
FIG. 11 is a front elevational diagrammatic illustration of an RF module shown in FIG. 10.
Figure 12:
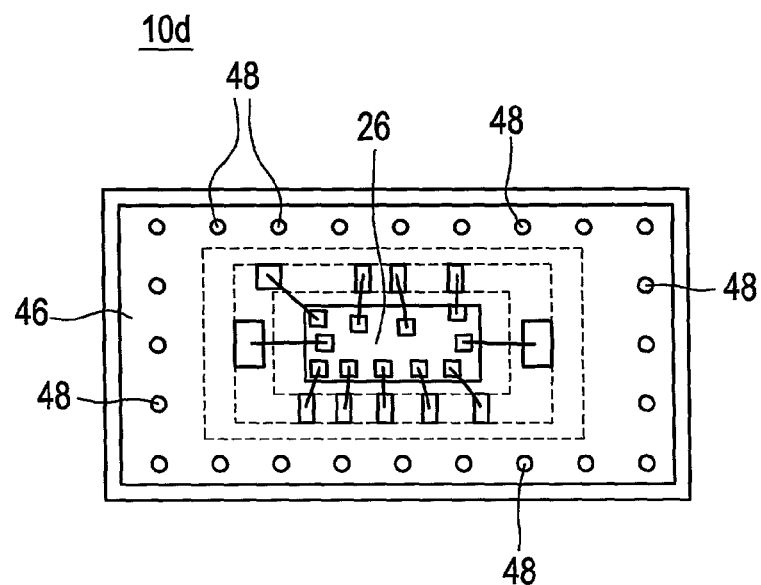
FIG. 12 is a diagrammatic bottom plan view of the RF module shown in FIG. 10.
Figure 13:
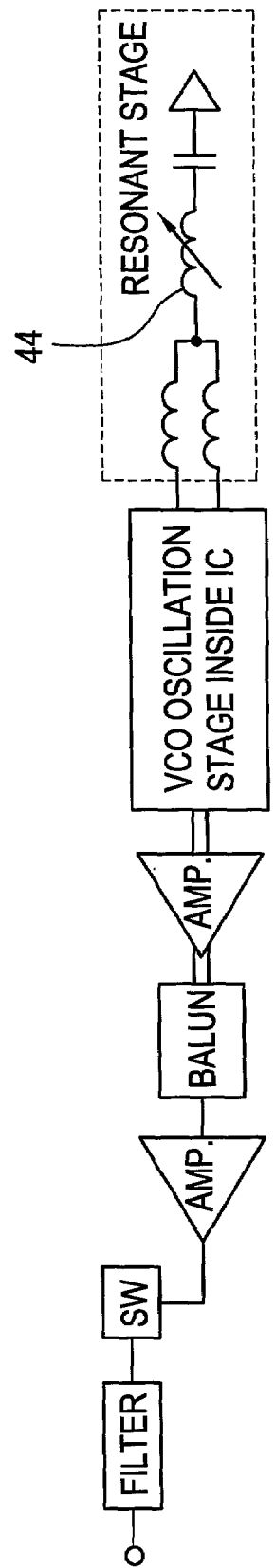
FIG. 13 is a block diagram showing circuit patterns including a trimming electrode pattern of a resonator incorporated in the RF module shown in FIG. 10.

FIG. 10 is a diagrammatic plan view of a further preferred embodiment of the RF module in accordance with the present invention, FIG. 11 is a front elevational diagrammatic illustration of the RF module, FIG. 12 is a diagrammatic bottom plan view of the RF module, and FIG. 13 is a block diagram showing patterns including a trimming electrode pattern of a resonator incorporated in the RF module.

Thus, the RF module 10d shown in FIG. 10 features an oscillator trimming electrode pattern 44 and other patterns disposed on the upper surface of the multi-layered substrate 12d.

The RF module 10d further has a ground electrode pattern for preventing RF signal radiation 46 disposed on the bottom surface of the RF-IC 26 in the multi-layered substrate 12d, as will be seen from FIG. 11.

Further, as shown in FIG. 12, the RF module 10d has a plurality of via holes 48 disposed in the multi-layered substrate 12d so as to surround the RF-IC 26. The ground electrode pattern for preventing RF signal radiation 46 is connected through these via holes 48 to the metallic cap 31 which is held at the ground potential.

The RF nodule 10d shown in FIG. 10 is configured so as to enable adjustment of the frequency characteristics such as an oscillation frequency and filter characteristics, through trimming of the trimming electrode pattern 44 by, for example, laser, while monitoring or measuring the total output waveform or total performance of the wireless section, as shown in FIG. 13. This allows the adjustment to be conducted based on the final characteristics obtained in the final structure incorporating circuits such as the built-in filter and an IC amplifier. It is therefore possible to stabilize the characteristics of the products and to improve the yield.

Further, in the RF module 10d shown in FIG. 10, the RF-IC 26 is surrounded by the ground electrode pattern for preventing RF signal radiation 46, the via holes 48 and a metallic cap 31, thus preventing unnecessary radiation of the RF signals from the RF-IC 26. This eliminates coupling between different circuits, thereby contributing to stabilization of the characteristics. In the RF module 10d shown in FIG. 10, the metallic cap 31 may be substituted by a resin filling the cavity 24 formed in the multi-layered substrate 12d. Such an alternative arrangement produces the same advantages as those described above, provided that a ground electrode pattern is disposed on the substrate mounting the RF module 10d.

In each of the RF modules described hereinbefore, the RF-IC is a preferably bare chip. The present invention, however, does not exclude the use of bare chips constituting ICs other than the RF-IC.

Each of the RF modules described above has only one cavity formed in the multi-layered substrate. The present invention, however, does not exclude the use of two or more cavities formed in the multi-layered substrate.

It is also possible to include two or more trimming electrode patterns.

The present invention provides an RF module that is so small that it is easily mountable in, for example, a mobile telephone.

Although the invention has been described through illustration and description of preferred embodiments thereof, it is to be understood that the above-described preferred embodiments are not exclusive and various changes and modifications may be imparted thereto without departing from the scope of the present invention which is limited solely by the appended claims.

What is claimed is:

1. An RF module comprising;
    a multi-layered substrate having a first major surface, a second major surface opposed to the first major surface, and side surfaces extending the between first and second major surfaces;
    a base-band IC, a memory IC and an RF-IC, said base-band IC and memory IC being mounted on the first major surface of said multi-layered substrate, and said RF-IC being mounted on the second major surface of said multi-layered substrate;
    an RF passive component incorporated in said multi-layered substrate;
    a wiring pattern incorporated in said multi-layered substrate, said wiring pattern interconnecting said base-band IC and said memory IC; and
    a shielding ground electrode pattern interposed between the first major surface of said multi-layered substrate on which said base-band IC and said memory IC are mounted and the second major surface of said multi-layered substrate on which said RF-IC is mounted.

2. An RF module according to claim 1, further comprising an antenna incorporated in said multi-layered substrate.

3. An RF module according to claim 1, wherein at least one of said base-band IC, said memory IC and said RF-IC is a bare chip.

4. An RF module according to claim 3, wherein at least one cavity is formed in a portion of said multi-layered substrate, and said bare chip is disposed in said at least one cavity.

5. An RF module according to claim 1, wherein the shielding ground electrode pattern is interposed between the first major surface of said multi-layered substrate on which said base-band IC and said memory IC are mounted and said RF passive component incorporated in said multi-layered substrate.

6. An RF module according to claim 1, further comprising at least one trimming electrode pattern disposed on one of the first and second major surfaces of said multi-layered substrate and arranged to enable adjustment of frequency characteristics of the RF module.

7. An RF module according to claim 4, wherein said RF-IC is a bare chip;

said shielding ground electrode pattern is arranged to prevent RF signal radiation provided within said multi-layered substrate at a location on a bottom surface of said bare chip, so as to prevent unnecessary radiation of RF signals from said RF-IC; and a plurality of via holes are arranged within said multi-layered substrate and around said bare chip, said via holes providing connection to said ground electrode pattern for preventing RF signal radiation.

8. An RF module according to claim 1, further comprising a metallic case disposed on said multi-layered substrate.

9. An RF module according to claim 8, wherein the metallic case is arranged to define a portion of an antenna.

* * * * *